US011763724B2

(12) United States Patent
Feng et al.

(10) Patent No.: US 11,763,724 B2
(45) Date of Patent: Sep. 19, 2023

(54) SHIFT REGISTER UNIT AND METHOD FOR DRIVING SHIFT REGISTER UNIT, GATE DRIVE CIRCUIT, AND DISPLAY DEVICE

(71) Applicants: HEFEI BOE JOINT TECHNOLOGY CO., LTD., Hefei (CN); BOE TECHNOLOGY GROUP CO., LTD., Beijing (CN)

(72) Inventors: Xuehuan Feng, Beijing (CN); Sixiang Wu, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/968,978

(22) PCT Filed: Oct. 28, 2019

(86) PCT No.: PCT/CN2019/113670
§ 371 (c)(1),
(2) Date: Aug. 11, 2020

(87) PCT Pub. No.: WO2021/081703
PCT Pub. Date: May 6, 2021

(65) Prior Publication Data

US 2021/0201753 A1 Jul. 1, 2021

(51) Int. Cl.
*G09G 3/20* (2006.01)
*G11C 19/28* (2006.01)
(Continued)

(52) U.S. Cl.
CPC ... *G09G 3/2092* (2013.01); *G09G 2300/0426* (2013.01); *G09G 2310/0286* (2013.01); *G09G 2310/08* (2013.01)

(58) Field of Classification Search
CPC ......... G09G 3/2092; G09G 2300/0426; G09G 2310/0286; G09G 2310/08; H01L 27/1251
See application file for complete search history.

(56) References Cited

U.S. PATENT DOCUMENTS 9,305,508 B2 4/2016 Park et al.
10,068,658 B2 9/2018 Wang
(Continued)

FOREIGN PATENT DOCUMENTS

CN 103579221 A 2/2014
CN 103927960 A 7/2014
(Continued)

OTHER PUBLICATIONS

First Chinese Office Action from Chinese Patent Application No. 201980002152.6 dated Mar. 9, 2022.
(Continued)

*Primary Examiner* — Lin Li
(74) *Attorney, Agent, or Firm* — Dilworth & Barrese, LLP.; Michael J. Musella, Esq.

(57) ABSTRACT

A shift register unit, a method for driving a shift register unit, a gate drive circuit, and a display device are disclosed. A shift register unit includes an input circuit, an output circuit, and a first control circuit. The input circuit controls a level of a first node in response to an input signal. The output circuit outputs at least one clock signal of at least one clock signal terminal to at least one signal output terminal under the control of the level of the first node, and outputs a level of a second node to at least one of the at least one signal output terminal in the case where the first node is at a non-operating potential. The first control circuit controls the level of the second node in response to the level of the first node.

13 Claims, 8 Drawing Sheets

10

(51) Int. Cl.

| | |
|---|---|
| ***G09G 3/3266*** | (2016.01) |
| ***G09G 3/36*** | (2006.01) |

(56) References Cited

U.S. PATENT DOCUMENTS

| | | | | |
|---|---|---|---|---|
| 10,902,930 | B2 | 1/2021 | Liu et al. | |
| 2007/0146289 | A1 | 7/2007 | Lee et al. | |
| 2007/0296660 | A1* | 12/2007 | Kimura | G09G 3/3688 345/87 |
| 2011/0057190 | A1* | 3/2011 | Kimura | H01L 27/1225 257/59 |
| 2014/0028534 | A1* | 1/2014 | Park | G02F 1/13454 345/84 |
| 2014/0160000 | A1* | 6/2014 | Ma | G11C 19/28 377/64 |
| 2016/0351111 | A1 | 12/2016 | Jin et al. | |
| 2019/0096312 | A1 | 3/2019 | Xue et al. | |
| 2019/0164498 | A1* | 5/2019 | Jang | G09G 3/3266 |
| 2019/0206294 | A1 | 7/2019 | Tian et al. | |
| 2020/0226993 | A1* | 7/2020 | Zhang | G09G 3/3677 |
| 2020/0273503 | A1 | 8/2020 | Wang | |
| 2021/0166633 | A1 | 6/2021 | Feng et al. | |
| 2021/0174717 | A1* | 6/2021 | Li | G09G 3/20 |

FOREIGN PATENT DOCUMENTS

| | | | | | |
|---|---|---|---|---|---|
| CN | 105845092 | A | | 8/2016 | |
| CN | 107316603 | A | * | 11/2017 | G09G 3/20 |
| CN | 107369407 | A | | 11/2017 | |
| CN | 108154835 | A | | 6/2018 | |
| CN | 207489450 | U | | 6/2018 | |
| CN | 108281123 | A | | 7/2018 | |
| CN | 108806628 | A | | 11/2018 | |
| CN | 109346007 | A | | 2/2019 | |
| CN | 109545156 | A | | 3/2019 | |
| CN | 109903729 | A | | 6/2019 | |
| CN | 110189680 | A | | 8/2019 | |
| EP | 3686894 | A1 | | 7/2020 | |
| WO | 20190568803 | A1 | | 3/2019 | |
| WO | WO 2019/019751 | A1 | * | 6/2019 | G11C 19/28 |

OTHER PUBLICATIONS

Extended European Search Report from Application No. 19945414.1 dated Sep. 13, 2022.

* cited by examiner

SHIFT REGISTER UNIT AND METHOD FOR DRIVING SHIFT REGISTER UNIT, GATE DRIVE CIRCUIT, AND DISPLAY DEVICE

TECHNICAL FIELD

Embodiments of the present disclosure relate to a shift register unit, a method for driving a shift register unit, a gate drive circuit, and a display device.

BACKGROUND

In the field of display technology, for example, a pixel array of liquid crystal display generally includes a plurality of rows of gate lines and a plurality of columns of data lines which are interleaved with each other. The driving of the gate lines can be implemented by an integrated drive circuit which is attached. In recent years, as the process for amorphous silicon thin films continues to be improved, gate line drive circuits can also be directly integrated on a thin film transistor array substrate so as to form a gate driver on array (GOA) for driving the gate lines.

For example, the GOA which is composed of a plurality of shift register units that are cascaded can be used to provide switching voltage signals to the plurality of rows of gate lines of a pixel array, so as to control the plurality of rows of gate lines to be turned on in sequence. And data signals can be provided by data lines to pixel units in corresponding rows in the pixel array, so as to form gray-scale voltages required for displaying various gray levels of an image, and then display the image for each frame.

SUMMARY

At least one embodiment of the present disclosure provides a shift register unit, which comprises: an input circuit, an output circuit, and a first control circuit. The input circuit is connected to a first node and a signal input terminal, and is configured to control a level of the first node in response to an input signal of the signal input terminal. The output circuit is connected to the first node, a second node, and at least one clock signal terminal, and the output circuit comprises at least one signal output terminal. The output circuit is configured to output a clock signal of the at least one clock signal terminal to the at least one signal output terminal under the control of the level of the first node, and output a level of the second node to the at least one signal output terminal in the case where the first node is at a non-operating potential. The first control circuit is connected to the first node and the second node, and is configured to control the level of the second node in response to the level of the first node.

For example, in the shift register unit provided by at least one embodiment of the present disclosure, the output circuit comprises an output sub-circuit and a voltage dividing control sub-circuit. The output sub-circuit is connected to the first node and the at least one clock signal terminal, and is configured to output the clock signal of the at least one clock signal terminal to the at least one signal output terminal under the control of the level of the first node. The voltage dividing control sub-circuit is connected to the second node, and is configured to output the level of the second node to the at least one signal output terminal in the case where the first node is at the non-operating potential, under the control of the level of the second node or a first voltage.

For example, in the shift register unit provided by at least one embodiment of the present disclosure, the voltage dividing control sub-circuit comprises a first transistor. A first electrode of the first transistor is connected to the second node, and a second electrode of the first transistor is connected to the at least one signal output terminal.

For example, in the shift register unit provided by at least one embodiment of the present disclosure, a gate electrode of the first transistor is connected to the second node.

For example, in the shift register unit provided by at least one embodiment of the present disclosure, a gate electrode of the first transistor is connected to a first voltage terminal to receive the first voltage.

For example, in the shift register unit provided by at least one embodiment of the present disclosure, the at least one signal output terminal comprises a first signal output terminal, a second signal output terminal, and a third signal output terminal, and the at least one clock signal terminal comprises a first clock signal terminal, a second clock signal terminal, and a third clock signal terminal. The output circuit is configured to output a clock signal of the first clock signal terminal to the first signal output terminal, output a clock signal of the second clock signal terminal to the second signal output terminal, and output a clock signal of the third clock signal terminal to the third signal output terminal, under the control of the level of the first node, and output the level of the second node to the third signal output terminal in the case where the first node is at the non-operating potential. The output sub-circuit is configured to output the clock signal of the first clock signal terminal to the first signal output terminal, output the clock signal of the second clock signal terminal to the second signal output terminal, and output the clock signal of the third clock signal terminal to the third signal output terminal, under the control of the level of the first node. The voltage dividing control sub-circuit is configured to output the level of the second node to the third signal output terminal in the case where the first node is at the non-operating potential, under the control of the level of the second node or the first voltage. The second electrode of the first transistor is connected to the third signal output terminal.

For example, in the shift register unit provided by at least one embodiment of the present disclosure, the output sub-circuit comprises a first output sub-circuit, a second output sub-circuit, and a third output sub-circuit. The first output sub-circuit comprises a second transistor and a first capacitor, the second output sub-circuit comprises a third transistor and a second capacitor, and the third output sub-circuit comprises a fourth transistor. A gate electrode of the second transistor is connected to the first node, a first electrode of the second transistor is connected to the first clock signal terminal to receive a first clock signal, and a second electrode of the second transistor is connected to the first signal output terminal. A gate electrode of the third transistor is connected to the first node, a first electrode of the third transistor is connected to the second clock signal terminal to receive a second clock signal, and a second electrode of the third transistor is connected to the second signal output terminal. A gate electrode of the fourth transistor is connected to the first node, a first electrode of the fourth transistor is connected to the third clock signal terminal to receive a third clock signal, and a second electrode of the fourth transistor is connected to the third signal output terminal. A first electrode of the first capacitor is connected to the first node, and a second electrode of the first capacitor is connected to the second electrode of the second transistor. A first electrode of the second capacitor is connected to the first node, and a second electrode of the second capacitor is connected to the second electrode of the third transistor.

For example, in the shift register unit provided by at least one embodiment of the present disclosure, an on resistance of the first transistor is less than an on resistance of the fourth transistor, in the case where a gate electrode of the first transistor is connected to a first voltage terminal to receive the first voltage.

For example, in the shift register unit provided by at least one embodiment of the present disclosure, the input circuit comprises a fifth transistor. A gate electrode of the fifth transistor is connected to the signal input terminal to receive the input signal, and a first electrode of the fifth transistor is connected to the first node.

For example, in the shift register unit provided by at least one embodiment of the present disclosure, a second electrode of the fifth transistor is connected to a second voltage terminal to receive a second voltage.

For example, in the shift register unit provided by at least one embodiment of the present disclosure, a second electrode of the fifth transistor is connected to the gate electrode of the fifth transistor to receive the input signal.

For example, in the shift register unit provided by at least one embodiment of the present disclosure, the first control circuit comprises a sixth transistor and a seventh transistor. A gate electrode of the sixth transistor and a first electrode of the sixth transistor are connected to a third voltage terminal to receive a third voltage, and a second electrode of the sixth transistor is connected to the second node. A gate electrode of the seventh transistor is connected to the first node, a first electrode of the seventh transistor is connected to the second node, and a second electrode of the seventh transistor is connected to a fourth voltage terminal to receive a fourth voltage.

For example, the shift register unit provided by at least one embodiment of the present disclosure further comprises a second control circuit. The second control circuit is connected to the second node, the first signal output terminal, and the second signal output terminal, and is configured to perform noise reduction on the first signal output terminal and the second signal output terminal under the control of the level of the second node.

For example, in the shift register unit provided by at least one embodiment of the present disclosure, the second control circuit comprises an eighth transistor and a ninth transistor. A gate electrode of the eighth transistor is connected to the second node, a first electrode of the eighth transistor is connected to the first signal output terminal, and a second electrode of the eighth transistor is connected to a fourth voltage terminal to receive a fourth voltage. A gate electrode of the ninth transistor is connected to the second node, a first electrode of the ninth transistor is connected to the second signal output terminal, and a second electrode of the ninth transistor is connected to the fourth voltage terminal to receive the fourth voltage.

For example, the shift register unit provided by at least one embodiment of the present disclosure further comprises a third control circuit. The third control circuit is connected to the first node and the second node, and is configured to control the level of the first node in response to the level of the second node.

For example, in the shift register unit provided by at least one embodiment of the present disclosure, the third control circuit comprises a tenth transistor. A gate electrode of the tenth transistor is connected to the second node, a first electrode of the tenth transistor is connected to the first node, and a second electrode of the tenth transistor is connected to a fourth voltage terminal to receive a fourth voltage.

For example, the shift register unit provided by at least one embodiment of the present disclosure further comprises a first reset circuit. The first reset circuit is connected to the first node, and is configured to reset the first node in response to a first reset signal.

For example, in the shift register unit provided by at least one embodiment of the present disclosure, the first reset circuit comprises an eleventh transistor. A gate electrode of the eleventh transistor is connected to a first reset signal terminal to receive the first reset signal, a first electrode of the eleventh transistor is connected to the first node, and a second electrode of the eleventh transistor is connected to a fourth voltage terminal to receive a fourth voltage.

For example, the shift register unit provided by at least one embodiment of the present disclosure further comprises a second reset circuit. The second reset circuit is connected to the first node, and is configured to reset the first node in response to a second reset signal.

For example, in the shift register unit provided by at least one embodiment of the present disclosure, the second reset circuit comprises a twelfth transistor. A gate electrode of the twelfth transistor is connected to a second reset signal terminal to receive the second reset signal, a first electrode of the twelfth transistor is connected to the first node, and a second electrode of the twelfth transistor is connected to a fourth voltage terminal to receive a fourth voltage.

At least one embodiment of the present disclosure further provides a gate drive circuit, which comprises a plurality of the described shift register units which are cascaded.

For example, in the gate drive circuit provided by at least one embodiment of the present disclosure, in the case where the at least one signal output terminal comprises a first signal output terminal, a second signal output terminal, and a third signal output terminal, a signal input terminal of an shift register unit at an nth stage is connected to a first signal output terminal or a second signal output terminal of a shift register unit at an (n−1)th stage. A first reset signal terminal of the shift register unit at the nth stage is connected to a first signal output terminal or a second signal output terminal of a shift register unit at an (n+1)th stage. And n is an integer greater than 1.

At least one embodiment of the present disclosure further provides a display device, which comprises the shift register unit described above or the gate drive circuit described above.

At least one embodiment of the present disclosure further provides a method for driving the described shift register unit, and the method comprises: in a first phase, the input circuit controlling the level of the first node in response to the input signal; in a second phase, the output circuit outputting the clock signal of the at least one clock signal terminal to the at least one signal output terminal under the control of the level of the first node; and in a third phase, the output circuit outputting the level of the second node to the at least one signal output terminal in the case where the first node is at the non-operating potential, under the control of the level of the second node or a first voltage.

BRIEF DESCRIPTION OF THE DRAWINGS

In order to more clearly illustrate the technical schemes of the embodiments of the present disclosure, the drawings of the embodiments are briefly described in the following. It is obvious that the described drawings below are only related to some embodiments of the disclosure and are not limitative to the disclosure.

DETAILED DESCRIPTION

Figure 1A:
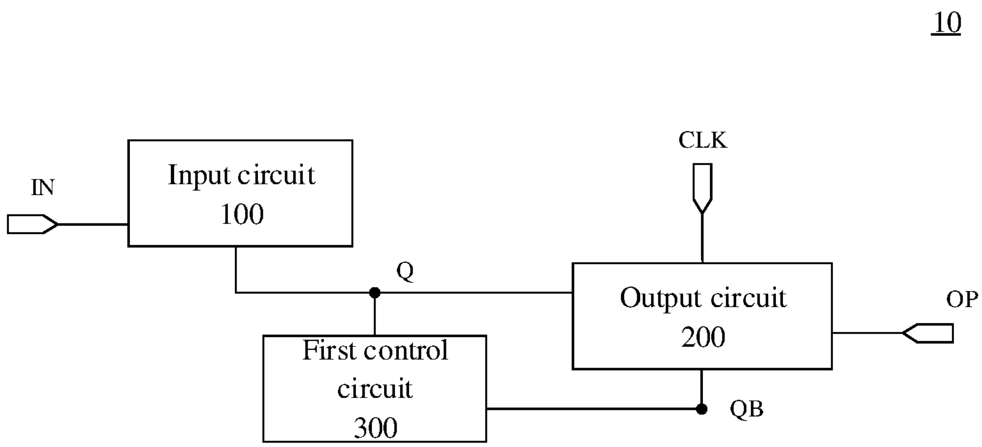
FIG. 1A is a schematic block diagram of a shift register unit provided by at least one embodiment of the present disclosure.

In order to make the objects, technical schemes and advantages of the embodiments of the present disclosure more clear, the technical schemes of the embodiments of the present disclosure will be described in a clear and full way in connection with the drawings. Obviously, the described embodiments are some embodiments of the present disclosure, not all embodiments. Based on the described embodiments of the present disclosure, all other embodiments obtained by those of ordinary skill in the art without the use of inventive faculty are within the scope of the present disclosure.

Unless otherwise defined, all the technical and scientific terms used herein have the same meanings as commonly understood by those of ordinary skill in the art to which the present disclosure belongs. The terms "first," "second," etc., which are used in the present disclosure, are not intended to indicate any sequence, amount or importance, but used to distinguish various components. Similarly, the terms, such as "a/an," "the," "one," etc., are not intended to indicate the limitation on amounts, but used to denote the presence of at least one. The terms, such as "comprise/comprising," "include/including," etc., are intended to specify that the elements or the objects stated before these terms encompass the elements or the objects and equivalents thereof listed after these terms, but not preclude other elements or objects. The terms, such as "connect/connecting/connected," "couple/coupling/coupled" etc., are not limited to a physical connection or mechanical connection, but may include an electrical connection/coupling, directly or indirectly. The terms, "on," "under," "left," "right," etc., are only used to indicate relative position relationship, and when the position of the object which is described is changed, the relative position relationship may be changed accordingly.

In display panel technology, in order to achieve low cost and narrow frame, the GOA technology can be adopted, that is, the gate drive circuit is integrated on a display panel through the process for thin film transistors, so that the narrow frame can be obtained and the assembly cost can be reduced. For example, the organic light emitting diode (OLED) display device generally includes a plurality of pixel units arranged in an array, and for example, each pixel unit can include a pixel circuit. In an OLED display device, the threshold voltages of drive transistors in each pixel circuit may be different because of the limitation of the manufacturing process, and the threshold voltages of the drive transistors may drift, for example, because of the influence of temperature variation. Thus, the difference between threshold voltages of respective drive transistors may lead to poor display (e.g., non-uniform display), and it is required to compensate the threshold voltages. In addition, in the case where the drive transistors are turned off, poor display may also occurred because of the existence of a leakage current. Therefore, OLED display devices usually adopt a pixel circuit having a compensation function. For example, transistors and/or capacitors are added on the basis of a basic pixel circuit (for example, 2T1C, i.e., including two transistors and one capacitor), so as to provide the compensation function. For example, the compensation function can be implemented by voltage compensation, current compensation or hybrid compensation, and the pixel circuit having the compensation function may be, for example, a common 4T1C or 4T2C circuit, or the like.

However, in order to implement the functions of a pixel circuit (e.g., a 4T1C circuit, etc.), such as the compensation function and the function of driving a light emitting element to emit light, it is required to provide a plurality of gate drive signals to the pixel circuit. Therefore, a GOA circuit corresponding to such a pixel circuit is more complex, so that the GOA circuit occupies a larger area on a display panel, which is adverse to the implementation of narrow frame.

At least one embodiment of the present disclosure provides a shift register unit, and the shift register unit includes an input circuit, an output circuit, and a first control circuit. The input circuit is connected to a first node and a signal input terminal, and is configured to control a level of the first node in response to an input signal of the signal input terminal. The output circuit is connected to the first node, a second node, and at least one clock signal terminal, and the output circuit includes at least one signal output terminal. The output circuit is configured to output a clock signal of the at least one clock signal terminal to the at least one signal output terminal under the control of the level of the first node, and output a level of the second node to the at least one signal output terminal in the case where the first node is at a non-operating potential. The first control circuit is connected to the first node and the second node, and is configured to control the level of the second node in response to the level of the first node.

At least one embodiment of the present disclosure provides a shift register unit, a method for driving the shift register unit, a gate drive circuit and a display device. The shift register unit can simultaneously provide a plurality of gate drive signals (for example, at least three different gate drive signals) which are required by pixel circuits. The circuit structure of the shift register unit is simple, so that the circuit structure of a corresponding GOA can be simplified, which facilitates the implementation of narrow frame.

Hereinafter, the embodiments of the present disclosure are described in detail with reference to the accompanying drawings. It should be noted that the same reference numerals in different drawings can be used to denote the same elements already described.

It should be noted that, in the embodiments of the present disclosure, for example, in the case where each circuit is implemented by N-type transistors, the term "pull-up" indicates charging a node or an electrode of a transistor so as to increase the absolute value of the level of the node or the electrode, thereby implementing the operation (e.g., turning on) of the corresponding transistor, the term "pull-down" indicates discharging a node or an electrode of a transistor so as to reduce the absolute value of the level of the node or the electrode, thereby implementing the operation (e.g., turning off) of the corresponding transistor, the term "operating potential" indicates that a node is at a high potential, so that when a gate electrode of a transistor is connected to the node, the transistor is turned on, and the term "non-operating potential" indicates that a node is at a low potential, so that when a gate electrode of a transistor is connected to the node, the transistor is turned off. For another example, in the case where each circuit is implemented by P-type transistors, the term "pull-up" indicates discharging a node or an electrode of a transistor, so as to reduce the absolute value of the level of the node or the electrode, thereby implementing the operation (e.g., turning on) of the corresponding transistor, the term "pull-down" indicates charging a node or an electrode of a transistor so as to increase the absolute value of the level of the node or the electrode, thereby implementing the operation (e.g., turning off) of the corresponding transistor, the term "operating potential" indicates that a node is at a low potential, so that when a gate electrode of a transistor is connected to the node, the transistor is turned on, and the term "non-operating potential" indicates that a node is at a high potential, so that when a gate electrode of a transistor is connected to the node, the transistor is turned off.

Figure 1B:
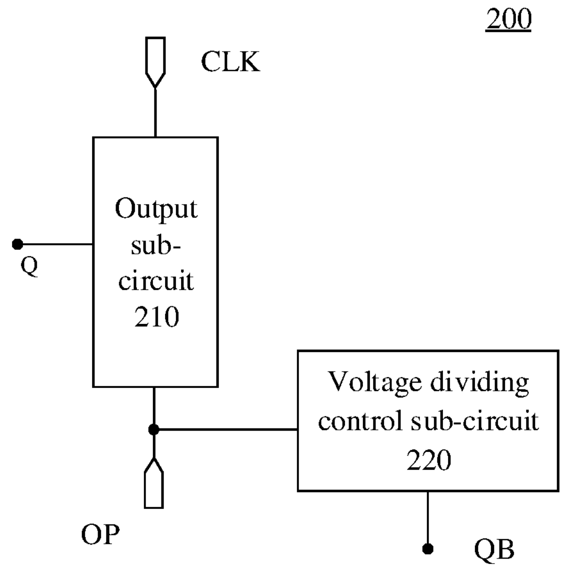
FIG. 1B is a schematic block diagram of an output circuit that is included in the shift register unit illustrated in FIG. 1A provided by at least one embodiment of the present disclosure.
Figure 1C:
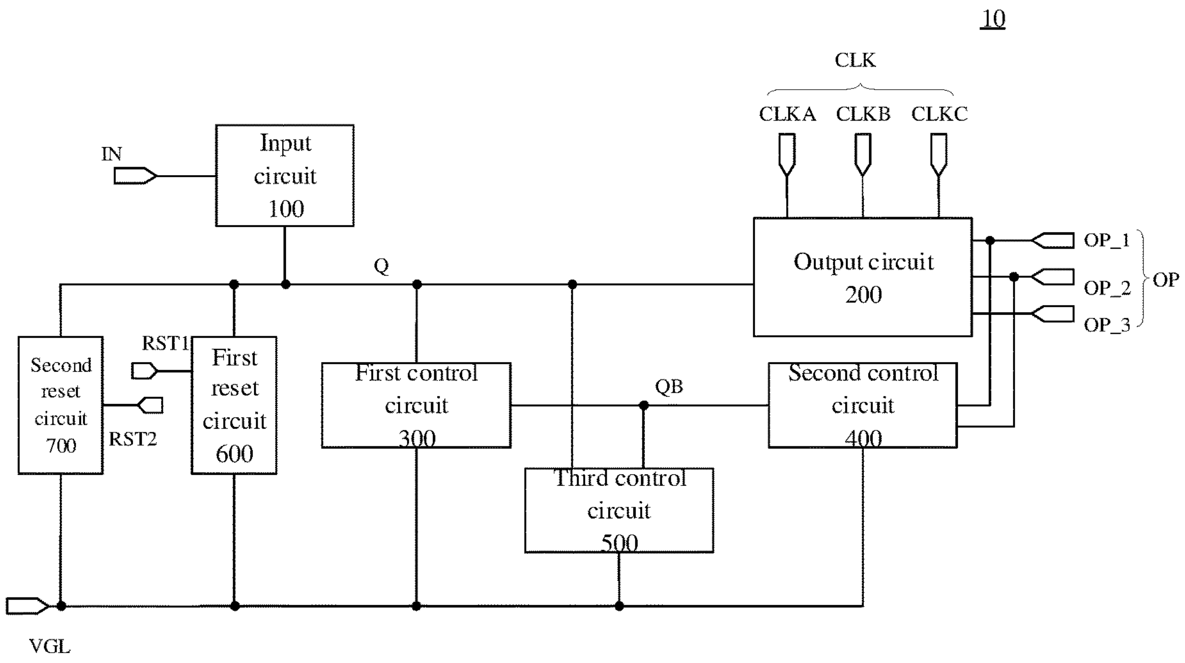
FIG. 1C is a schematic block diagram of another shift register unit provided by at least one embodiment of the present disclosure.

FIG. 1A is a schematic block diagram of a shift register unit provided by at least one embodiment of the present disclosure, FIG. 1B is a schematic block diagram of an output circuit that is included in the shift register unit illustrated in FIG. 1A provided by at least one embodiment of the present disclosure, and FIG. 1C is a schematic block diagram of another shift register unit provided by at least one embodiment of the present disclosure.

With reference to FIG. 1A, a shift register unit 10 includes an input circuit 100, an output circuit 200, and a first control circuit 300.

For example, the input circuit 100 is connected to a first node Q (e.g., a pull-up node) and a signal input terminal IN, and is configured to control a level of the first node Q in response to an input signal of the signal input terminal IN. For example, in some examples, in the case where the input circuit 100 is turned on in response to the input signal from the signal input terminal IN, the input signal provided by the signal input terminal IN is input to the first node Q, or a power supply voltage terminal (e.g., a high voltage terminal) that is provided separately is electrically connected to the first node Q, thereby pulling up the level of the first node Q to an operating potential, e.g., a high level.

For example, the output circuit 200 is connected to the first node Q, a second node QB (e.g., a pull-down node) and at least one clock signal terminal CLK, and the output circuit 200 may include at least one signal output terminal OP, as illustrated in FIG. 1A. The output circuit 200 is configured to output a clock signal of the at least one clock signal terminal CLK to the at least one signal output terminal OP under the control of the level of the first node Q, and output a level of the second node QB to at least one signal output terminal OP in the case where the first node Q is at a non-operating potential.

For example, as illustrated in FIG. 1A, the first control circuit 300 is connected to the first node Q and the second node QB, and is configured to control the level of the second node QB in response to the level of the first node Q.

For example, as illustrated in FIG. 1B, in some examples, the output circuit 200 includes an output sub-circuit 210 and a voltage dividing control sub-circuit 220. For example, as illustrated in FIG. 1B, in some examples, the output sub-circuit 210 is connected to the first node Q and the at least one clock signal terminal CLK, and is configured to output the clock signal of the at least one clock signal terminal CLK to the at least one signal output terminal OP under the control of the level of the first node Q. For example, as illustrated in FIG. 1B, in some examples, the voltage dividing control sub-circuit 220 is connected to the second node QB, and is configured to output the level of the second node QB to at least one signal output terminal OP in the case where the first node Q is at the non-operating potential, under the control of the level of the second node QB or a power supply voltage that is provided separately.

For example, in some examples, as illustrated in FIG. 1C, the at least one signal output terminal OP in the shift register unit 10 may include a first signal output terminal OP_1, a second signal output terminal OP_2, and a third signal output terminal OP_3, and the at least one clock signal terminal CLK in the shift register unit 10 includes a first clock signal terminal CLKA, a second clock signal terminal CLKB, and a third clock signal terminal, as illustrated in FIG. 1C.

For example, in some examples, in the case where the output circuit 200 is turned on under the control of the level of the first node Q, the at least one clock signal terminal CLK and the at least one signal output terminal OP are electrically connected, respectively, so that clock signals (e.g., CLKA, CLKB, and CLKC) that are provided by the at least one clock signal terminal CLK can be output to the corresponding at least one signal output terminal OP (e.g., OP_1, OP_2, and OP_3), respectively. For example, as illustrated in FIG. 1C, in the case where the output circuit 200 is turned on, the first clock signal terminal CLKA is electrically connected to the first signal output terminal OP_1, the second clock signal terminal CLKB is electrically connected to the second signal output terminal OP_2, and the third clock signal terminal CLKC is electrically connected to the third signal output terminal OP_3. In the case where the output circuit 200 is turned off under the control of the level of the first node Q, the at least one clock signal terminal CLK and the at least one signal output terminal OP are disconnected. In this case, the third signal output terminal OP_3 is electrically connected to the second node QB, thereby outputting the level of the second node QB to the third signal output terminal OP_3.

In this embodiment, for example, as illustrated in FIG. 1C, the first control circuit 300 is electrically connected to the first node Q and the second node QB, and is configured to control the level of the second node QB in response to the level of the first node Q. For example, the first control circuit 300 is also electrically connected to a voltage terminal VGL, and the voltage terminal VGL may be configured to keep inputting a direct current low-level signal, for example, be grounded. For example, in the case where the first node Q is at an operating potential (e.g., a high level), the first control circuit 300 pulls down the second node QB to a non-operating potential (e.g., a low level). In the case where the first node Q is at the non-operating potential (e.g., the low level), the first control circuit 300 pulls up the second node QB to the operating potential (e.g., the high level). Therefore, the shift register unit 10 provided by the embodiments of the present disclosure can simultaneously provide at least one (e.g., three) gate drive signal required by a corresponding pixel circuit (e.g., a 4T1C circuit). The circuit structure of the shift register unit 10 is simple, and the circuit structure of the corresponding GOA can be simplified, so that the frame of a display panel which adopts the shift register unit 10 can be narrowed.

It should be noted that in the embodiments of the present disclosure, "in the case where the first node Q is at a non-operating potential" indicates that in the case where the first node Q is at a low potential, that is, the output circuit 200 is turned off under the control of the level of the first node Q (for example, a transistor that is included in the output circuit 200 is turned off under the control of the level of the first node Q), and the at least one clock signal terminal CLK and the at least one signal output terminal OP are disconnected, so that the at least one clock signal which is provided by the at least one clock signal terminal CLK cannot be transmitted to the at least one signal output terminal OP. While, in the case where the first node Q is at an operating potential, that is, in the case where the first node Q is at a high potential, the output circuit 200 is turned on under the control of the level of the first node Q (for example, a transistor included in the output circuit 200 is turned on under the control of the level of the first node Q), and the at least one clock signal terminal CLK is electrically connected to the at least one signal output terminal OP, so that the at least one clock signal which is provided by the at least one clock signal terminal CLK is transmitted to the at least one signal output terminal OP.

For example, in at least one embodiment of the present disclosure, as illustrated in FIG. 1C, the shift register unit 10 may further include a second control circuit 400, a third control circuit 500, a first reset circuit 600, and a second reset circuit 700 in addition to the input circuit 100, the output circuit 200, and the first control circuit 300. In this embodiment, the input circuit 100, the output circuit 200, and the first control circuit 300 are basically the same as the input circuit 100, the output circuit 200, and the first control circuit 300 in the shift register unit 10 illustrated in FIG. 1A, which may not be repeated here.

For example, as illustrated in FIG. 1C, the second control circuit 400 is connected to the second node QB, the first signal output terminal OP_1, and the second signal output terminal OP_2, and is configured to perform noise reduction on the first signal output terminal OP_1 and the second signal output terminal OP_2 under the control of the level of the second node QB. For example, in the case where the second node QB is at an operating potential, the first signal output terminal OP_1 and the second signal output terminal OP_2 are electrically connected to the voltage terminal VGL, respectively, so that the first signal output terminal OP_1 and the second signal output terminal OP_2 are de-noised.

For example, as illustrated in FIG. 1C, the third control circuit 500 is connected to the first node Q and the second node QB, and is configured to control the level of the first node Q in response to the level of the second node QB. For example, in the case where the third control circuit 500 is turned on in response to the level of the second node QB, the first node Q is electrically connected to the voltage terminal VGL, thereby pulling down the first node Q to a non-operating potential (e.g., the low level) so as to implement the noise reduction.

For example, as illustrated in FIG. 1C, the first reset circuit 600 is configured to reset the first node Q in response to a first reset signal. For example, as illustrated in FIG. 1C, the first reset circuit 600 may be connected to the voltage terminal VGL, a first reset signal terminal RST1, and the first node Q. In the case where the first reset circuit 600 is turned on in response to the first reset signal provided by the first reset signal terminal RST1, the first node Q and the voltage terminal VGL are electrically connected, so that the first node Q is reset.

For example, the second reset circuit 700 is configured to reset the first node Q in response to a second reset signal. For example, as illustrated in FIG. 1C, the second reset circuit 700 may be connected to the voltage terminal VGL, a second reset signal terminal RST2, and the first node Q. In the case where the second reset circuit 700 is turned on in response to the second reset signal (e.g., a frame reset signal) provided by the second reset signal terminal RST2, the first node Q and the voltage terminal VGL are electrically connected, so that the first node Q is reset. For example, the second reset signal terminal RST2 is used to output an effective frame reset signal after the scanning for each frame or before the scanning for each frame. In the case where a plurality of shift register units 10 are cascaded to form a gate drive circuit, the frame reset signal that is output by the second reset signal terminal RST2 can control the second reset circuits 700 in all shift register units 10 to reset the corresponding first nodes Q.

It should be noted that, in the example illustrated in FIG. 1C, the first control circuit 300, the second control circuit 400, the third control circuit 500, the first reset circuit 600, and the second reset circuit 700 are all connected to the voltage terminal VGL so as to receive a direct current low-level signal, but the embodiments of the present disclosure are not limited thereto. The first control circuit 300, the second control circuit 400, the third control circuit 500, the first reset circuit 600, and the second reset circuit 700 may also be connected to different voltage terminals to receive different low-level signals, as long as each circuit can implement respective functions, and the embodiments of the present disclosure are not limited thereto.

Figure 2:
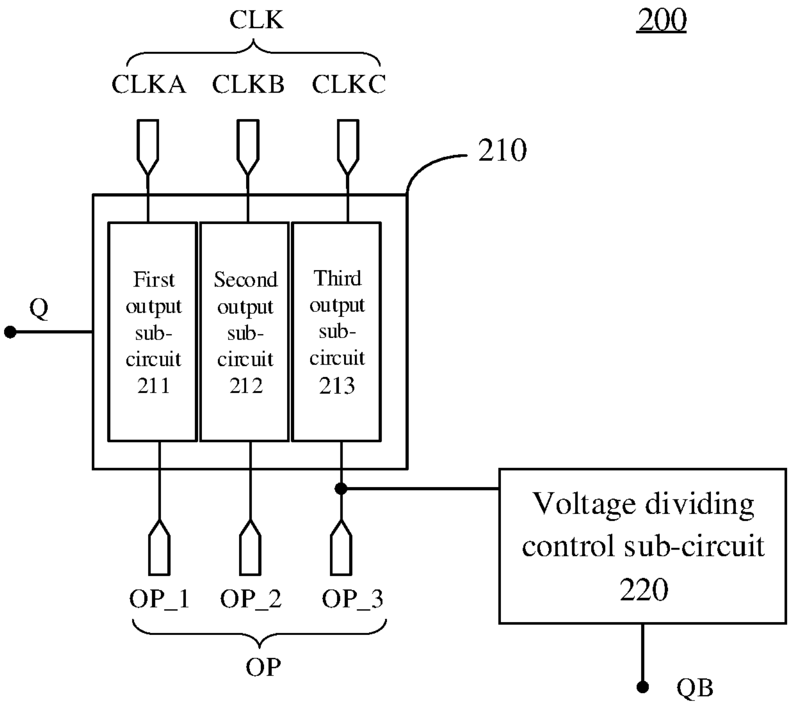
FIG. 2 is a schematic block diagram of an output circuit that is included in the shift register unit illustrated in FIG. 1C provided by at least one embodiment of the present disclosure.

FIG. 2 is a schematic block diagram of the output circuit 200 that is included in the shift register unit 10 illustrated in FIG. 1C provided by at least one embodiment of the present disclosure. As illustrated in FIG. 2, the output circuit 200 may include an output sub-circuit 210 and a voltage dividing control sub-circuit 220. The at least one clock signal terminal CLK includes a first clock signal terminal CLKA, a second clock signal terminal CLKB, and a third clock signal terminal CLKC. The at least one signal output terminal OP includes a first signal output terminal OP_1, a second signal output terminal OP_2, and a third signal output terminal OP_3. For example, as illustrated in FIG. 2, the output sub-circuit 210 is connected to the first node Q, a plurality of clock signal terminals CLK, and a plurality of signal output terminals OP, and the output sub-circuit 210 is configured to output clock signals of the at least one clock signal terminal CLK to the at least one signal output terminal OP, respectively, under the control of the level of the first node Q. For example, the output sub-circuit 210 may include a first output sub-circuit 211, a second output sub-circuit 212, and a third output sub-circuit 213.

The first output sub-circuit 211 is configured to output a first clock signal to the first signal output terminal OP_1 under the control of the level of the first node Q. For example, the first output sub-circuit 211 may be connected to the first node Q, the first clock signal terminal CLKA, and the first signal output terminal OP_1. In the case where the first output sub-circuit 211 is turned on under the control of the level of the first node Q, the first clock signal terminal CLKA and the first signal output terminal OP_1 are electrically connected, so that the first clock signal provided by the first clock signal terminal CLKA is output to the first signal output terminal OP_1 as a first output signal.

The second output sub-circuit 212 is configured to output a second clock signal to the second signal output terminal OP_2 under the control of the level of the first node Q. For example, the second output sub-circuit 212 may be connected to the first node Q, the second clock signal terminal CLKB, and the second signal output terminal OP_2. In the case where the second output sub-circuit 212 is turned on under the control of the level of the first node Q, the second clock signal terminal CLKB and the second signal output terminal OP_2 are electrically connected, so that the second clock signal provided by the second clock signal terminal CLKB is output to the second signal output terminal OP_2 as a second output signal.

The third output sub-circuit 213 is configured to output a third clock signal to the third signal output terminal OP_3 under the control of the level of the first node Q. For example, the third output sub-circuit 213 may be connected to the first node Q, the third clock signal terminal CLKC, and the third signal output terminal OP_3. In the case where the third output sub-circuit 213 is turned on under the control of the level of the first node Q, the third clock signal terminal CLKC and the third signal output terminal OP_3 are electrically connected, so that the third clock signal provided by the third clock signal terminal CLKC is output to the third signal output terminal OP_3 as a third output signal.

The voltage dividing control sub-circuit 220 is connected to the second node QB and the third signal output terminal OP_3, and is configured to output the level of the second node QB to the third signal output terminal OP_3 under the control of the level of the second node QB or a power supply voltage that is provided separately in the case where the first node Q to which the output sub-circuit 210 is connected is at a non-operating potential.

Figure 3A:
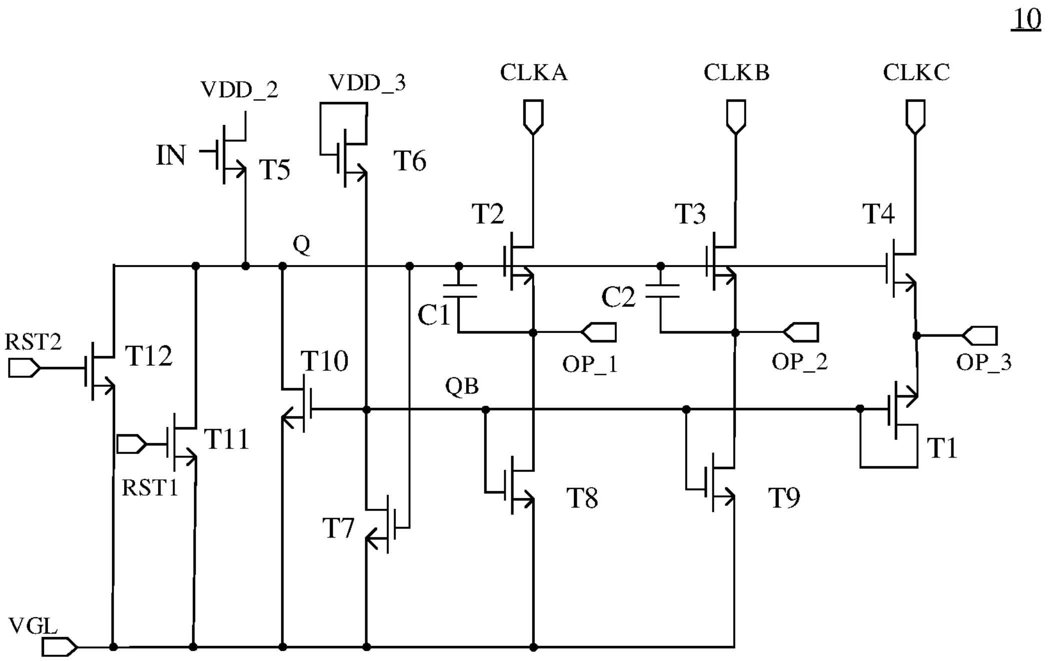
FIG. 3A is a circuit structure diagram of a shift register unit provided by at least one embodiment of the present disclosure.
Figure 3B:
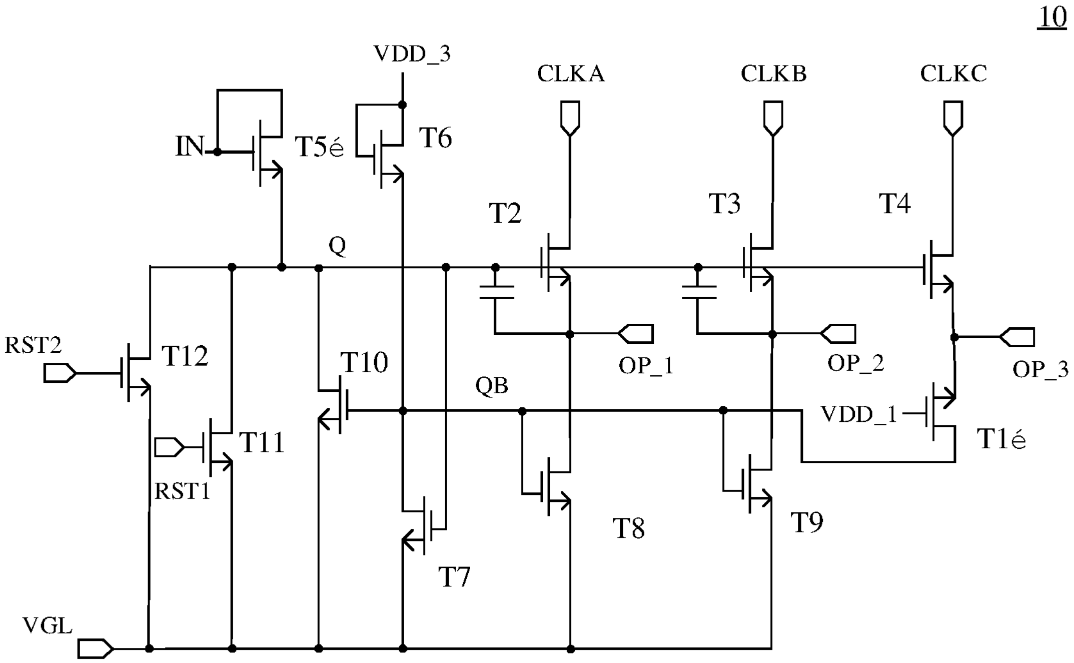
FIG. 3B is a circuit structure diagram of another shift register unit provided by at least one embodiment of the present disclosure.

FIG. 3A is a circuit structure diagram of a shift register unit 10 provided by at least one embodiment of the present disclosure, and FIG. 3B is another circuit structure diagram of a shift register unit 10 provided by at least one embodiment of the present disclosure. With reference to FIGS. 1B to 3B, the embodiments of the present disclosure are illustrated by taking the case that each transistor is an N-type transistor as an example, but the embodiments of the present disclosure are not limited thereto.

As illustrated in FIG. 3A, the voltage dividing control sub-circuit 220 may include a first transistor T1. For example, a gate electrode of the first transistor T1 and a first electrode of the first transistor T1 are connected and further connected to the second node QB, and a second electrode of the first transistor T1 is connected to the third signal output terminal OP_3.

For example, in the case where the second node QB (i.e., the pull-down node) is at the operating potential (e.g., the high level), the first transistor T1 is turned on, and the second node QB is electrically connected to the third signal output terminal OP_3, so that the high level of the second node QB is output to the third signal output terminal OP_3, thereby a output signal of the third signal output terminal OP_3 is controlled by the level of the second node QB and outputs a high level.

Alternatively, as illustrated in FIG. 3B, in some other examples, the voltage dividing control sub-circuit 220 may include a first transistor T1'. For example, a gate electrode of the first transistor T1' is connected to a first voltage terminal VDD_1 so as to receive a first voltage, a first electrode of the first transistor T1' is connected to the second node QB, and a second electrode of the first transistor T1' is connected to the third signal output terminal OP_3.

For example, because the gate electrode of the first transistor T1' illustrated in FIG. 3B is connected to the first voltage terminal VDD_1 so as to receive the first voltage, in the case where the first voltage is at a high level, the first transistor T1' is turned on, and the second node QB is electrically connected to the third signal output terminal OP_3, so that the high level of the second node QB is output to the third signal output terminal OP_3, thereby a output signal of the third signal output terminal OP_3 is controlled by the level of the second node QB and outputs a high level.

In some examples, for example, the first output sub-circuit 211 includes a second transistor T2 and a first capacitor C1, the second output sub-circuit 212 includes a third transistor T3 and a second capacitor C2, and the third output sub-circuit 213 includes a fourth transistor T4. For example, a gate electrode of the second transistor T2 is connected to the first node Q, a first electrode of the second transistor T2 is connected to the first clock signal terminal CLKA to receive a first clock signal, and a second electrode of the second transistor T2 is connected to the first signal output terminal OP_1. A gate electrode of the third transistor T3 is connected to the first node Q, a first electrode of the third transistor T3 is connected to the second clock signal terminal CLKB to receive a second clock signal, and a second electrode of the third transistor T3 is connected to the second signal output terminal OP_2. A gate electrode of the fourth transistor T4 is connected to the first node Q, a first electrode of the fourth transistor T4 is connected to the third clock signal terminal CLKC to receive a third clock signal, and a second electrode of the fourth transistor T4 is connected to the third signal output terminal OP_3. A first electrode of the first capacitor C1 is connected to the first node Q, and a second electrode of the first capacitor C1 is connected to the second electrode of the second transistor T2. A first electrode of the second capacitor C2 is connected to the first node Q, and a second electrode of the second capacitor C2 is connected to the second electrode of the third transistor T3.

For example, in the case where the first node Q (i.e., the pull-up node) is at an operating potential (e.g., the high level), the second transistor T2, the third transistor T3, and the fourth transistor T4 are all turned on, so that the first clock signal CLKA, the second clock signal CLKB, and the third clock signal CLKC are output to the first signal output terminal OP_1, the second signal output terminal OP_2, and the third signal output terminal OP_3, respectively.

It should be noted that in various embodiments of the present disclosure, the storage capacitor (for example, the first capacitor C1 and the second capacitor C2 in FIG. 3A and FIG. 3B) can be a capacitor device manufactured by a process, for example, a capacitor device implemented by manufacturing a special capacitor electrode, and each electrode of the storage capacitor can be implemented by a metal layer, a semiconductor layer (for example, doped polysilicon), etc. The storage capacitor can also be a parasitic capacitor between transistors, and can be implemented by the transistors themselves and other devices and wires, as long as the level of the first node Q can be maintained and the bootstrap function can be implemented in the case where the first signal output terminal OP_1 and the second signal output terminal OP_2 output signals.

It should be noted that, for convenience and conciseness of description, in various embodiments of the present disclosure, CLKA can denote both the first clock signal terminal and the first clock signal provided by the first clock signal terminal. Similarly, CLKB can denote both the second clock signal terminal and the second clock signal provided by the second clock signal terminal. Similarly, CLKC can denote both the third clock signal terminal and the third clock signal provided by the third clock signal terminal.

For example, in some examples, the on resistance of the first transistor T1' may be less than the on resistance of the fourth transistor T4 by designing the proportional relationship between the width-to-length ratio of the channel of the first transistor T1' and the width-to-length ratio of the channel of the fourth transistor T4 in FIG. 3B. For example, the width-to-length ratio of the channel of the fourth transistor T4 may be greater than the width-to-length ratio of the channel of the first transistor T1'. In this way, in the case where the third signal output terminal OP_3 is required to output the third clock signal CLKC, that is, in the case where both the fourth transistor T4 and the first transistor T1' are turned on, the voltage division of the first transistor T1' is relatively small, thereby reducing the influence on the third output signal output by the third signal output terminal OP_3, so that the third output signal is equal to or approximately equal to the third clock signal CLKC.

As illustrated in FIG. 3A, for example, in some examples, the input circuit 100 may include a fifth transistor T5. For example, a gate electrode of the fifth transistor T5 is connected to the signal input terminal IN to receive the input signal, a first electrode of the fifth transistor T5 is connected to the first node Q, and a second electrode of the fifth transistor T5 is connected to a second voltage terminal VDD_2 to receive a second voltage.

For example, in the case where the input signal is at an active level (e.g., the high level), the fifth transistor T5 is turned on, so that the second voltage terminal VDD_2 is electrically connected to the first node Q, thereby the second voltage (e.g., the high level) provided by the second voltage terminal VDD_2 is input to the first node Q, and the potential of the first node Q is pulled up to an operating potential.

For example, in some examples, the high level of the first voltage provided by the first voltage terminal VDD_1 and the high level of the second voltage provided by the second voltage terminal VDD_2 may be the same.

Alternatively, as illustrated in FIG. 3B, the input circuit 100 may include a fifth transistor T5'. For example, a first electrode of the fifth transistor T5' is connected to the first node Q, and a gate electrode of the fifth transistor T5' and a second electrode of the fifth transistor T5' are connected and further connected to the signal input terminal IN to receive the input signal.

For example, in the case where the input signal provided by the signal input terminal IN is at an active level (e.g., the high level), the fifth transistor T5' is turned on, and both the first electrode of the fifth transistor T5' and the gate electrode of the fifth transistor T5' are connected to the signal input terminal IN to receive the input signal, thereby pulling up the potential of the first node Q to an operating potential. In this case, the input signal may function as an input control signal, so that the number of the signal terminals and the number of the signals can be reduced, the control mode can be simplified, and the production cost can be reduced.

As illustrated in FIG. 3A and FIG. 3B, the first control circuit 300 may include a sixth transistor T6 and a seventh transistor T7. For example, a gate electrode of the sixth transistor T6 and a first electrode of the sixth transistor T6 are connected to a third voltage terminal VDD_3 to receive a third voltage (e.g., the high level), and a second electrode of the sixth transistor T6 is connected to the second node QB. A gate electrode of the seventh transistor T7 is connected to the first node Q, a first electrode of the seventh transistor T7 is connected to the second node QB, and a second electrode of the seventh transistor T7 is connected to a fourth voltage terminal (e.g., the voltage terminal VGL described above) to receive a fourth voltage (e.g., the low level).

For example, in the case where the first node Q is at an operating potential (e.g., the high level), the seventh transistor T7 is turned on, and the potential of the second node QB can be pulled down to a non-operating potential (e.g., the low level) by designing the proportional relationship between the width-to-length ratio of the channel of the sixth transistor T6 and the width-to-length ratio of the channel of the seventh transistor T7. In the case where the first node Q is at the non-operating potential, the seventh transistor T7 is turned off and the third voltage terminal VDD_3 is configured to provide the third voltage (e.g., the high level). Therefore, the sixth transistor T6 is turned on, and a high level signal provided by the third voltage terminal VDD_3 is written into the second node QB through the sixth transistor T6 so as to pull up the potential of the second node QB to the operating potential (e.g., the high level).

The second control circuit 400 may include an eighth transistor T8 and a ninth transistor T9. For example, a gate electrode of the eighth transistor T8 is connected to the second node QB, a first electrode of the eighth transistor T8 is connected to the first signal output terminal OP_1, and a second electrode of the eighth transistor T8 is connected to a fourth voltage terminal (e.g., the voltage terminal VGL described above) to receive a fourth voltage. A gate electrode of the ninth transistor T9 is connected to the second node QB, a first electrode of the ninth transistor T9 is connected to the second signal output terminal OP_2, and a second electrode of the ninth transistor T9 is connected to the fourth voltage terminal (e.g., the voltage terminal VGL described above) to receive the fourth voltage.

For example, in the case where the second node QB is at an operating potential (e.g., the high level), the eighth transistor T8 and the ninth transistor T9 are both turned on, and the first signal output terminal OP_1 and the second signal output terminal OP_2 are both electrically connected to the voltage terminal VGL, thereby reducing the noise of the first signal output terminal OP_1 and the second signal output terminal OP_2. For example, the fourth voltage terminal is configured to keep inputting a fourth voltage of a direct current low level, and the fourth voltage terminal can adopt the voltage terminal VGL described above or a voltage terminal that is provided separately, and the embodiments of the present disclosure are not limited thereto.

The third control circuit 500 may include a tenth transistor T10. For example, a gate electrode of the tenth transistor T10 is connected to the second node QB, a first electrode of the tenth transistor T10 is connected to the first node Q, and a second electrode of the tenth transistor T10 is connected to a fourth voltage terminal (e.g., the voltage terminal VGL described above) to receive a fourth voltage.

For example, in the case where the second node QB is at an operating potential (e.g., the high level), the tenth transistor T10 is turned on, and the first node Q is electrically connected to the voltage terminal VGL, so that a low voltage is written into the first node Q to reduce the noise of the first node Q.

The first reset circuit 600 includes an eleventh transistor T11. For example, a gate electrode of the eleventh transistor T11 is connected to the first reset signal terminal RST1 to receive the first reset signal, a first electrode of the eleventh transistor T11 is connected to the first node Q, and a second electrode of the eleventh transistor T11 is connected to a fourth voltage terminal (e.g., the voltage terminal VGL described above) to receive a fourth voltage.

For example, in the case where the eleventh transistor T11 is turned on in response to the first reset signal provided by the first reset signal terminal RST1, the first node Q is electrically connected to the voltage terminal VGL, thereby writing a low voltage into the first node Q to reset the first node Q.

The second reset circuit 700 includes a twelfth transistor T12. For example, a gate electrode of the twelfth transistor T12 is connected to the second reset signal terminal RST2 to receive a second reset signal, a first electrode of the twelfth transistor T12 is connected to the first node Q, and a second electrode of the twelfth transistor T12 is connected to a fourth voltage terminal (e.g., the voltage terminal VGL described above) to receive a fourth voltage.

For example, in the case where the twelfth transistor T12 is turned on in response to the second reset signal provided by the second reset signal terminal RST2 (for example, the second reset signal may be the frame reset signal), the first node Q is electrically connected to the voltage terminal VGL, so that a low voltage is written into the first node Q to reset the first node Q.

It should be noted that, in the description of various embodiments of the present disclosure, the first node Q and the second node QB do not denote actual components, but denote the convergence points of related electrical connections in circuit diagrams.

It should be noted that, the transistors adopted in the embodiments of the present disclosure may be thin film transistors, field effect transistors or other switching devices having the same characteristics, and all the embodiments of the present disclosure take the thin film transistors as examples. The source electrode and the drain electrode of a transistor used herein can be symmetrical in structure, and thus, there is no difference in structure between the source electrode and the drain electrode. In the embodiments of the present disclosure, in order to distinguish the two electrode (i.e., the source electrode and the drain electrode) of the transistor except the gate electrode, it is directly described that one electrode is a first electrode and the other electrode is a second electrode.

In addition, the transistor in the embodiments of this disclosure is illustrated by taking an N-type transistor as an example. In this case, the first electrode of the transistor is the drain electrode and the second electrode of the transistor is the source electrode. It should be noted that the present disclosure includes, but is not limited thereto. For example, one or more transistors in the shift register unit 10 provided by the embodiments of the present disclosure can also adopt P-type transistors, and in this case, the first electrode of the transistor is the source electrode and the second electrode is the drain electrode, and thus it is only required to connect the electrodes of the specified type of transistors with reference to the connection manners of the electrodes of the corresponding transistors in the embodiments of the present disclosure, and provide the corresponding voltage terminals with the corresponding high-level voltages or low-level voltages, respectively. In the case where an N-type transistor is used, indium gallium zinc oxide (IGZO) may be used as the active layer of the thin film transistor, which can effectively reduce the size of the transistor and prevent the leakage current, compared with the case that low temperature poly silicon (LTPS) or amorphous silicon (such as hydrogenated amorphous silicon) is used as the active layer of the thin film transistor.

Figure 4:
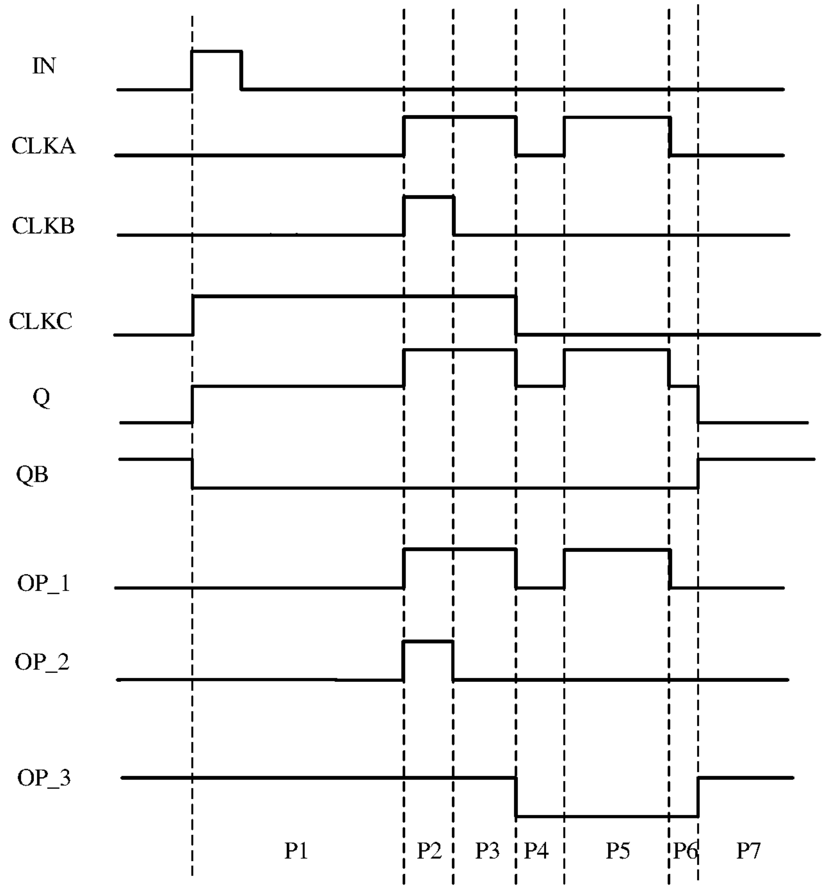
FIG. 4 is a signal timing diagram of a shift register unit provided by at least one embodiment of the present disclosure.

FIG. 4 is a signal timing diagram of a shift register unit provided by the embodiments of the present disclosure. The operating principle of the shift register unit 10 illustrated in FIG. 3A and FIG. 3B are illustrated with reference to the signal timing diagram illustrated in FIG. 4. It should be noted that the level (high level or low level) of the potential in the signal timing diagram illustrated in FIG. 4 is only schematic and does not indicate the true potential value.

It should be noted that, in FIG. 3A, FIG. 3B, FIG. 4 and the description below, IN, CLKA, CLKB, CLKC, VDD_1, VDD_2, VDD_3, OP_1, OP_2, OP_3, VGL, RST1, and RST2 are not only used to denote the corresponding signal terminals, but also used to denote the corresponding signals.

First, in an initial phase P0 (not illustrated in FIG. 4), the second reset signal RST2 is at a high level. The twelfth transistor T12 is turned on, so as to reset the first node Q. In this case, the input signal IN is at a low level. For example, in the case where a plurality of shift register units 10 are cascaded, the first nodes Q of the plurality of shift register units 10 can be reset simultaneously in this phase.

As illustrated in FIG. 4, in a first phase P1, the input signal IN is at the high level. In this case, the fifth transistor T5 in FIG. 3A is turned on, and the second voltage terminal VDD_2 is electrically connected to the first node Q, thereby pulling up the first node Q to the high level. Alternatively, the fifth transistor t T5' in FIG. 3B is turned on, so that a high level signal of the signal input terminal IN is output to the first node Q, thereby pulling up the first node Q to the high level. In this case, the second transistor T2, the third transistor T3, and the fourth transistor T4 are turned on under the control of the high level of the first node Q, and output the first clock signal CLKA, the second clock signal CLKB, and the third clock signal CLKC to the first signal output terminal OP_1, the second signal output terminal OP_2, and the third signal output terminal OP_3, respectively. In this case, because the first clock signal CLKA and the second clock signal CLKB are at the low level, both the first signal output terminal OP_1 and the second signal output terminal OP_2 output the low level. In this case, the third clock signal CLKC is at the high level, so the third signal output terminal OP_3 outputs the high level. The seventh transistor T7 is turned on and the sixth transistor T6 is turned on, so that the second node QB is at the low level because of the voltage division effect of the seventh transistor T7 and the sixth transistor T6.

In a second phase P2, the first clock signal CLKA and the second clock signal CLKB change from the low level to the high level, and the third clock signal CLKC remains at the high level. Because of the bootstrap effect of the first capacitor C1 and the second capacitor C2, the potential of the first node Q further rises. In this case, the second transistor T2, the third transistor T3, and the fourth transistor T4 are turned on more fully, and the high levels of the first clock signal CLKA and the second clock signal CLKB are output to the first signal output terminal OP_1 and the second signal output terminal OP_2, respectively, while the third signal output terminal OP_3 still outputs the high level.

In a third phase P3, the second clock signal CLKB changes from the high level to the low level, and the first clock signal CLKA and the third clock signal CLKC remains at the high level. Because of the bootstrap effect of the first capacitor C1, the potential of the first node Q keeps unchanged. In this case, the second transistor T2, the third transistor T3, and the fourth transistor T4 are all turned on, the first signal output terminal OP_1 and the third signal output terminal OP_3 keep outputting the high level, and the second signal output terminal OP_2 outputs the low level.

In a fourth phase P4, the first clock signal CLKA and the third clock signal CLKC change from the high level to the low level, and the second clock signal CLKB remains at the low level. Because of the bootstrap effect of the first capacitor C1, the potential of the first node Q is reduced a little but still at the high level. In this case, the second transistor T2, the third transistor T3, and the fourth transistor T4 are all turned on, and the low levels of the first clock signal CLKA, the second clock signal CLKB, and the third clock signal CLKC are respectively output to the first signal output terminal OP_1, the second signal output terminal OP_2, and the third signal output terminal OP_3.

In a fifth phase P5, the first clock signal CLKA changes from the low level to the high level, while the second clock signal CLKB and the third clock signal CLKC remain at the low level. Because of the bootstrap effect of the first capacitor C1, the potential of the first node Q is further increased. In this case, the second transistor T2, the third transistor T3, and the fourth transistor T4 all remain turned on. The high level of the first clock signal CLKA is output to the first signal output terminal OP_1, and the low levels of the second clock signal CLKB and the third clock signal CLKC are output to the second signal output terminal OP_2 and the third signal output terminal OP_3, respectively.

In a sixth phase P6, the first clock signal CLKA changes from the high level to the low level, while the second clock signal CLKB and the third clock signal CLKC remain at the low level. Because of the bootstrap effect of the first capacitor C1, the potential of the first node Q is reduced a little but still at the high level. In this case, the second transistor T2, the third transistor T3, and the fourth transistor T4 all remain turned on. The low levels of the first clock signal CLKA, the second clock signal CLKB, and the third clock signal CLKC are output to the first signal output terminal OP_1, the second signal output terminal OP_2, and the third signal output terminal OP_3, respectively.

In a seventh phase P7, the first reset signal RST1 (not illustrated in FIG. 4) is at the high level, and the eleventh transistor T11 is turned on, so that the first node Q is reset and the first node Q is at the low level. In this case, the second transistor T2, the third transistor T3, and the fourth transistor T4 are all turned off. The seventh transistor T7 is also turned off, and the second node QB is pulled up to an operating potential, i.e., the high level, by the sixth transistor T6 which is turned on. The tenth transistor T10 is turned on under the function of the high level of the second node QB, so that the noise of the first node Q is further reduced. The eighth transistor T8 and the ninth transistor T9 are also turned on under the function of the high level of the second node QB, thereby reducing the noise of the first signal output terminal OP_1 and the second signal output terminal OP_2. The first transistor T1 in FIG. 3A is turned on under the function of the high level of the second node QB, and the fourth transistor T4 is turned off under the function of the low level of the first node Q. In this case, the third signal output terminal OP_3 outputs the high level under the control of the high level of the second node QB. Similarly, the first transistor T1' in FIG. 3B remains turned on under the function of the first voltage (e.g., the high level) provided by the first voltage terminal VDD_1, and the fourth transistor T4 is turned off under the function of the low level of the first node Q, so that the third signal output terminal OP_3 outputs the level of the second node QB, that is, outputs the high level.

It should be noted that, in the embodiments of the present disclosure, the period when the first node Q is at the non-operating potential may refer to the seventh phase P7. In the seventh phase P7, the first node Q changes to the low level and is at the non-operating potential. In this case, the second transistor T2, the third transistor T3, and the fourth transistor T4 are all turned off, so that the first clock signal CLKA, the second clock signal CLKB, and the third clock signal CLKC cannot be transmitted to the first signal output terminal OP_1, the second signal output terminal OP_2, and the third signal output terminal OP_3. Accordingly, the period when the first node Q is at the operating potential may refer to the first phase P1 to the sixth phase P6. During the period from the first phase P1 to the sixth phase P6, the first node Q is at the high level, that is, at the operating potential. In this case, the second transistor T2, the third transistor T3, and the fourth transistor T4 are all turned on, so that the first clock signal CLKA, the second clock signal CLKB, and the third clock signal CLKC are transmitted to the first signal output terminal OP_1, the second signal output terminal OP_2, and the third signal output terminal OP_3, respectively.

For example, the first output signal OP_1, the second output signal OP_2, and the third output signal OP_3 are provided to a pixel circuit (e.g., a 4T1C circuit), so that the pixel circuit drives a corresponding light emitting element to emit light and has a compensation function. Therefore, the shift register unit 10 provided by the embodiments of the present disclosure can simultaneously provide a plurality of output signals (for example, at least three different signals), and has a simple circuit structure, so that the corresponding GOA circuit structure can be simplified, and the frame can be narrowed.

At least one embodiment of the present disclosure also provides a gate drive circuit, and the gate drive circuit includes a plurality of shift register units provided by any embodiment of the present disclosure which are cascaded. The gate drive circuit can simultaneously provide a plurality of gate drive signals that are required by the corresponding pixel circuits, has a simple circuit structure, and facilitate the implementation of narrow frame.

Figure 5:
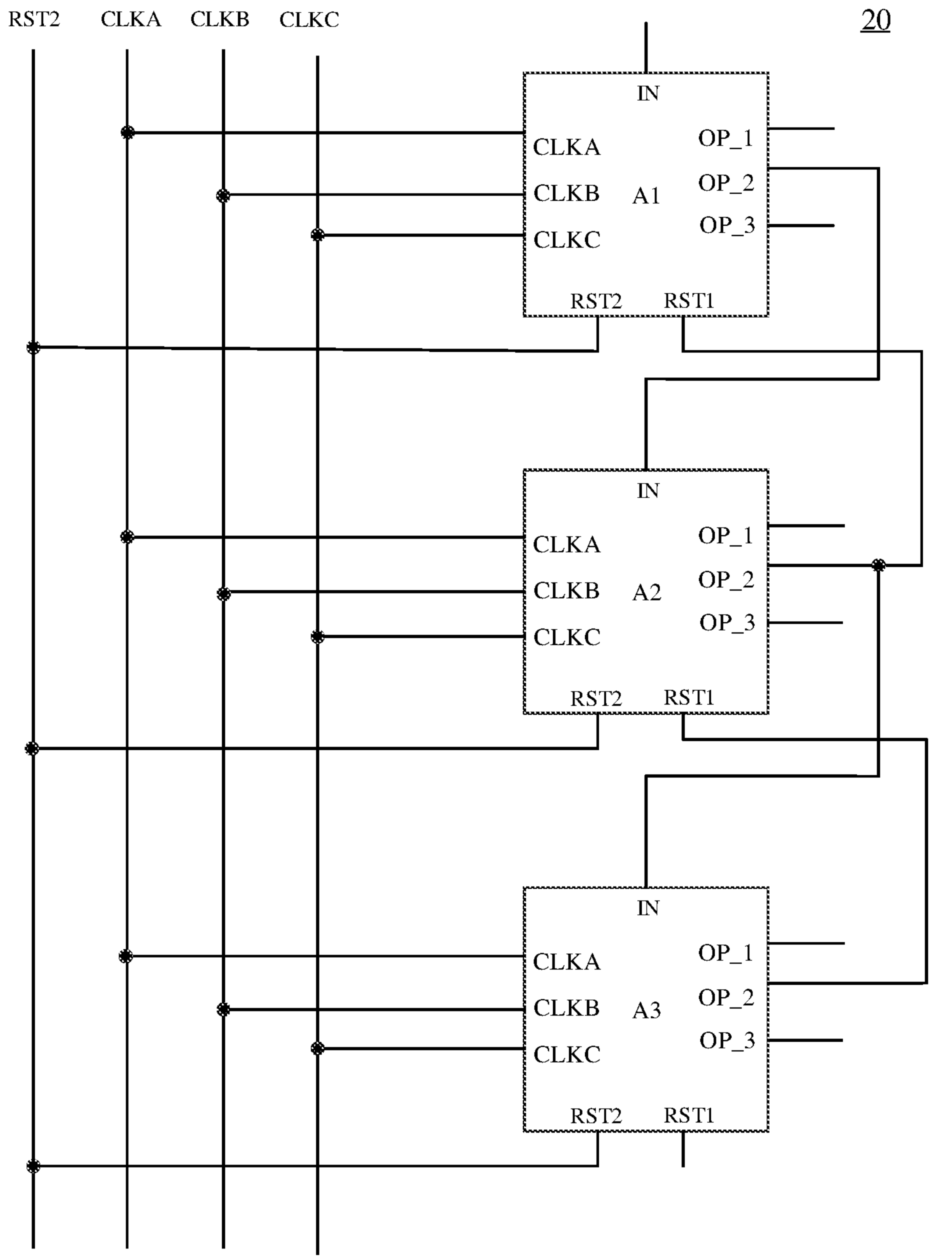
FIG. 5 is a schematic block diagram of a gate drive circuit provided by at least one embodiment of the present disclosure.

FIG. 5 is a schematic block diagram of a gate drive circuit provided by at least one embodiment of the present disclosure. As illustrated in FIG. 5, a gate drive circuit 20 includes a plurality of shift register units (e.g., A1, A2, A3, etc.) which are cascaded. The number of the shift register units is not limited and can be determined according to actual requirements. For example, the shift register unit may adopt the shift register unit 10 described in any embodiment of the present disclosure. For example, in the gate drive circuit 20, part or all of the shift register units may adopt the shift register unit 10 described in any embodiment of the present disclosure. For example, the gate drive circuit 20 can be directly integrated on an array substrate of a display device by adopting the same process as that of the thin film transistors, so as to form the GOA, so that the progressive scanning driving function can be implemented, for example.

For example, in some examples, as illustrated in FIG. 5, each shift register unit may have a signal input terminal IN, a first clock signal terminal CLKA, a second clock signal terminal CLKB, a third clock signal terminal CLKC, a first signal output terminal OP_1, a second signal output terminal OP_2, a third signal output terminal OP_3, a first reset signal terminal RST1, and a second reset signal terminal RST2.

For example, in the gate drive circuit 20 provided by at least one embodiment of the present disclosure, a signal input terminal IN of a shift register unit at the nth stage is connected to the first signal output terminal OP_1 or the second signal output terminal OP_2 of a shift register unit at the (n−1)th stage. A first reset signal terminal RST1 of the shift register unit at the nth stage is connected to the first signal output terminal OP_1 or the second signal output terminal OP_2 of a shift register unit at the (n+1)th stage. And n is an integer greater than 1.

For example, in some examples, as illustrated in FIG. 5, except the shift register unit at the last stage (e.g., the third shift register unit A3), the first reset signal terminal RST1 of a shift register unit at a certain stage is connected to the second signal output terminal OP_2 of a shift register unit at the next stage. Except the shift register unit at the first stage (e.g., the first shift register unit A1), a signal input terminal IN of a shift register unit at a certain stage is connected to the second signal output terminal OP_2 of a shift register unit at the previous stage. The signal input terminal IN of the shift register unit at the first stage may be configured to receive a trigger signal STV, and the first reset signal terminal RST1 of the shift register unit at the last stage may be configured to receive a reset signal RESET, and the trigger signal STV and the reset signal RESET are not illustrated in FIG. 5.

For example, in some other examples, except the shift register unit at the last stage (e.g., the third shift register unit A3), the first reset signal terminal RST1 of a shift register unit at a certain stage may also be connected to the first signal output terminal OP_1 of a shift register unit at the next stage. Except the shift register unit at the first stage (e.g., the first shift register unit A1), the signal input terminal IN of a shift register unit at a certain stage can also be connected to the first signal output terminal OP_1 of a shift register unit at the previous stage, and the embodiments of the present disclosure are not limited thereto.

As illustrated in FIG. 5, the gate drive circuit 20 may further include a first clock signal line CLKA_L, a second clock signal line CLKB_L, and a third clock signal line CLKC_L. For example, the first clock signal line CLKA_L may be connected to the first clock signal terminal CLKA of the shift register unit at each stage, the second clock signal line CLKB_L is connected to the second clock signal terminal CLKB of the shift register unit at each stage, and the third clock signal line CLKC_L is connected to the third clock signal terminal CLKC of the shift register unit at each stage. It should be noted that the embodiments of this disclosure include but are not limited to the connection manners described above. For example, in some other examples, the first clock signal terminal CLKA, the second clock signal terminal CLKB, and the third clock signal terminal CLKC of each shift register unit in the gate drive circuit 20 may be connected to a plurality of clock signal lines that are provided separately, and for example, the plurality of clock signal lines are more than three clock signal lines. For example, not all the first clock signal terminals CLKA are connected to the same clock signal line, not all the second clock signal terminals CLKB are connected to the same clock signal line, and not all the third clock signal terminals CLKC are connected to the same clock signal line, which can be determined according to actual requirements, and the embodiments of the present disclosure are not limited thereto.

For example, the clock signal timings provided on the first clock signal line CLKA_L, the second clock signal line CLKB_L, and the third clock signal line CLKC_L may adopt the signal timing illustrated in FIG. 5, so as to implement the function of simultaneously outputting a plurality of gate drive signals by the gate drive circuit 20.

As illustrated in FIG. 5, the gate drive circuit 20 may further include a second reset signal line RST2_L (i.e., a frame reset signal line). For example, the second reset signal line RST2_L may be configured to be connected to the second reset signal terminal RST2 of the shift register unit at each stage (for example, the first shift register unit A1, the second shift register unit A2, and the third shift register unit A3).

For example, the gate drive circuit 20 may further include a timing controller T-CON. For example, the timing controller T-CON is configured to be connected to the first clock signal line CLKA_L, the second clock signal line CLKB_L, the third clock signal line CLKC_L, and the second reset signal line RST2_L, so as to provide each clock signal and the second reset signal to the shift register unit at each stage. The timing controller T-CON may also be configured to provide the trigger signal STV and the reset signal RESET. It should be noted that the phase relationship between a plurality of clock signals provided by the timing controller T-CON can be determined according to actual requirements. In different examples, according to different configurations, more clock signals can be provided.

For example, in some examples, in the case where the gate drive circuit 20 is used to drive a display panel, the gate drive circuit 20 may be disposed on a side of the display panel. For example, the gate drive circuit 20 can be directly integrated on an array substrate of the display panel by adopting the same process as that of the thin film transistors, so as to form the GOA, thereby implementing the driving function. Of course, the gate drive circuits 20 can also be disposed on both sides of the display panel, so as to implement the bilateral driving, and the embodiments of the present disclosure do not limit the arrangement of the gate drive circuit 20. The operating principle of the gate drive circuit 20 can be referred to the corresponding description of the operating principle of the shift register unit 10 in the embodiments of the present disclosure, which may not be repeated here.

At least one embodiment of the present disclosure also provides a display device. The display device includes the shift register unit described in any embodiment of the present disclosure or the gate drive circuit described in any embodiment of the present disclosure. The circuit structure of the shift register unit or the gate drive circuit in the display device is simple, and the display device can simultaneously provide a plurality of gate drive signals that are required by the pixel circuits, and facilitate the implementation of narrow frame.

Figure 6:
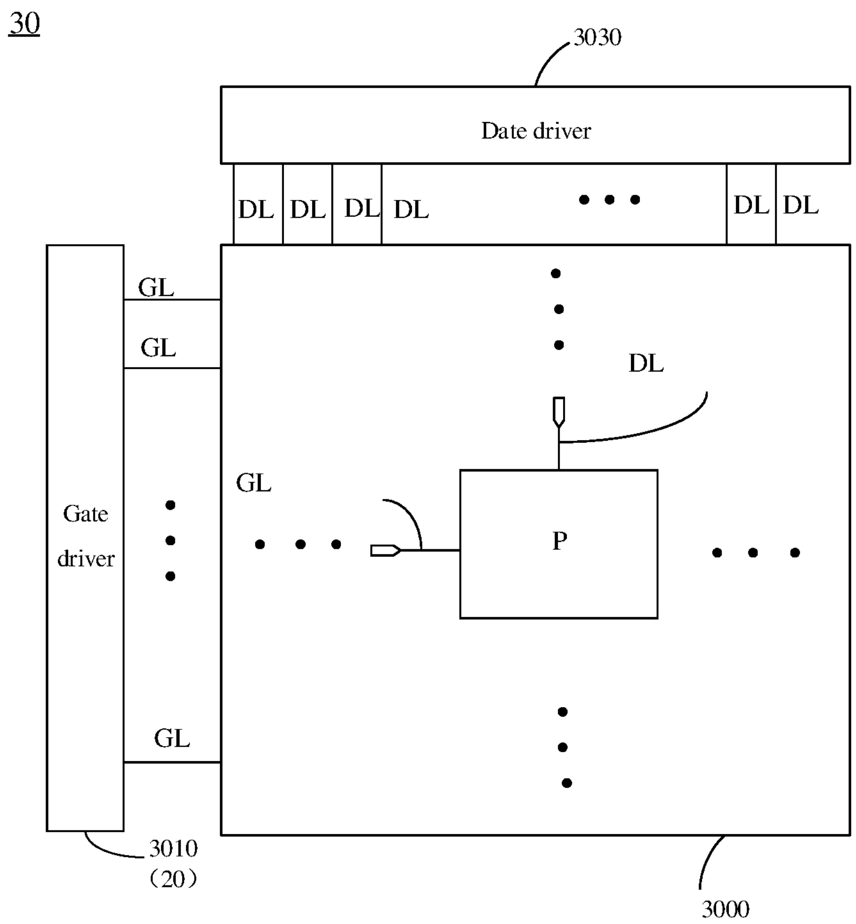
FIG. 6 is a schematic block diagram of a display device provided by at least one embodiment of the present disclosure.

FIG. 6 is a schematic block diagram of a display device provided by at least one embodiment of the present disclosure. For example, as illustrated in FIG. 6, a display device 30 includes a gate drive circuit 20, and the gate drive circuit 20 can be the gate drive circuit 20 provided by any embodiment of the present disclosure. For example, the display device 30 in this embodiment can be a liquid crystal display panel, a liquid crystal TV, an OLED display panel, an OLED TV, an OLED display, a quantum dot light emitting diode (QLED) display panel, etc., and can also be any product or component having a display function, such as an e-book, a mobile phone, a tablet computer, a notebook computer, a digital photo frame, a navigator, etc. The embodiments of the present disclosure are not limited thereto. The technical effects of the display device 30 can be referred to the corresponding descriptions of the shift register unit 10 and the gate drive circuit 20 in the above embodiments, which may not be repeated here.

For example, in some examples, the display device 30 includes a display panel 3000, a gate driver 3010, and a data driver 3030. The display panel 3000 includes a plurality of pixel units P that are defined by a plurality of scanning lines GL and a plurality of data lines DL which are intersected. The gate driver 3010 is used for driving the plurality of scanning lines GL. The data driver 3030 is used for driving the plurality of data lines DL. The data driver 3030 is electrically connected to the pixel units P through the data lines DL, and the gate driver 3010 is electrically connected to the pixel units P through the scanning lines GL.

For example, the gate driver 3010 and the data driver 3030 may be implemented as semiconductor chips. The display device 30 may also include other components, such as a timing controller, a signal decoding circuit, a voltage conversion circuit, etc. These components may adopt existing conventional components, which may not be repeated here.

Figure 7:
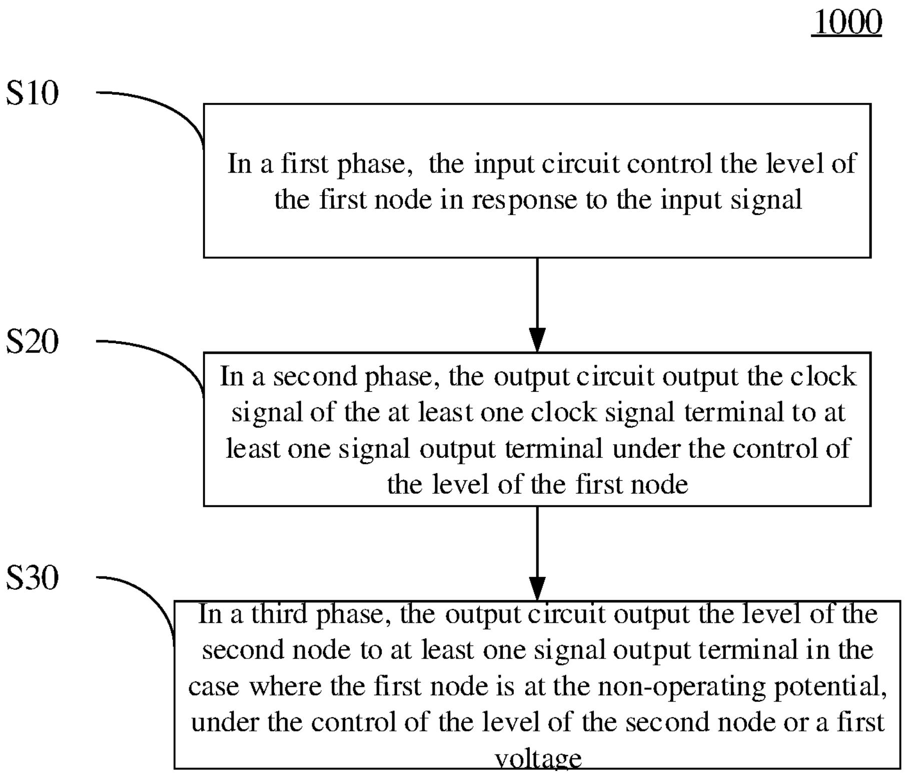
FIG. 7 is a flowchart of a method for driving a shift register unit provided by at least one embodiment of the present disclosure.

FIG. 7 is a flowchart of a method 1000 for driving the shift register unit provided by at least one embodiment of the present disclosure. For example, as illustrated in FIG. 7, the method 1000 for driving the shift register unit may include:

step S10: in a first phase, controlling, by the input circuit, the level of the first node in response to the input signal;

step S20: in a second phase, outputting, by the output circuit, the clock signal of the at least one clock signal terminal to the at least one signal output terminal under the control of the level of the first node; and step S30: in a third phase, outputting, by the output circuit, the level of the second node to at least one signal output terminal in the case where the first node is at the non-operating potential, under the control of the level of the second node or a first voltage.

The detailed description and technical effects of the method provided by the embodiments of the present disclosure can be referred to the corresponding descriptions of the shift register unit 10 and the gate drive circuit 20 in the embodiments of the present disclosure, which may not be repeated here.

For the present disclosure, the following statements should be noted.

(1) The accompanying drawings involve only the structure(s) in connection with the embodiment(s) of the present disclosure, and other structure(s) can be referred to common design(s).

(2) In case of no conflict, the embodiments of the present disclosure and features in the embodiments may be combined with each other to obtain new embodiments.

What are described above are related to the specific implementations of the present disclosure only and not limitative to the scope of the disclosure, and the scope of the disclosure is defined by the accompanying claims.

What is claimed is:

1. A shift register unit, comprising: an input circuit, an output circuit, a first control circuit, a second control circuit, and a third control circuit, wherein the input circuit is connected to a first node and a signal input terminal, and is configured to control a level of the first node in response to an input signal of the signal input terminal;

the output circuit is connected to the first node, a second node, and at least one clock signal terminal, and the output circuit comprises at least one signal output terminal;

the output circuit is configured to output at least one clock signal of the at least one clock signal terminal to the at least one signal output terminal under control of the level of the first node, and output a level of the second node to at least one of the at least one signal output terminal in a case where the first node is at a non-operating potential; and the first control circuit is connected to the first node and the second node, and is configured to control the level of the second node in response to the level of the first node;

wherein the output circuit comprises an output sub-circuit and a voltage dividing control sub-circuit; the output sub-circuit is connected to the first node and the at least one clock signal terminal, and is configured to output the at least one clock signal of the at least one clock signal terminal to the at least one signal output terminal under control of the level of the first node, and the voltage dividing control sub-circuit is connected to the second node, and is configured to output, through the voltage dividing control sub-circuit, the level of the second node to the at least one signal output terminal in the case where the first node is at the non-operating potential, under control of the level of the second node, wherein the output sub-circuit comprises the third output sub-circuit comprising a fourth transistor;

a gate electrode of the fourth transistor is connected to the first node, a first electrode of the fourth transistor is connected to a third clock signal terminal to receive a third clock signal, and a second electrode of the fourth transistor is connected to a third signal output terminal;

the voltage dividing control sub-circuit comprises a first transistor, a first electrode of the first transistor is connected to the second node, a second electrode of the first transistor is connected to the third signal output terminal, a gate electrode of the first transistor is connected to the second node, and the voltage dividing control sub-circuit is configured to output the level of the second node to the third signal output terminal in the case where the gate electrode of the fourth transistor is at the non-operating potential, under control of the level of the first and second nodes in a reset period, wherein the second control circuit is connected to the second node, and the output circuit, wherein the third control circuit is connected to the first node and the second node, and the third control circuit comprises a tenth transistor; and a gate electrode of the tenth transistor is connected to the second node, a first electrode of the tenth transistor is connected to the first node, and a second electrode of the tenth transistor is connected to a fourth voltage terminal to receive a fourth voltage, and wherein the width-to-length ratio of the channel of the fourth transistor is greater than the width-to-length ratio of the channel of the first transistor.

2. The shift register unit according to claim 1, wherein the at least one signal output terminal comprises a first signal output terminal, a second signal output terminal, and a third signal output terminal, and the at least one clock signal terminal comprises a first clock signal terminal, a second clock signal terminal, and a third clock signal terminal; and the output sub-circuit is configured to output a clock signal of the first clock signal to the first signal output terminal, output a clock signal of the second clock signal to the second signal output terminal, and output a clock signal of the third clock signal to the third signal output terminal, under control of the level of the first node.

3. The shift register unit according to claim 2, wherein the output sub-circuit comprises a first output sub-circuit and a second output sub-circuit;

the first output sub-circuit comprises a second transistor and a first capacitor and the second output sub-circuit comprises a third transistor and a second capacitor;

a gate electrode of the second transistor is connected to the first node, a first electrode of the second transistor is connected to the first clock signal terminal to receive a first clock signal, and a second electrode of the second transistor is connected to the first signal output terminal;

a gate electrode of the third transistor is connected to the first node, a first electrode of the third transistor is connected to the second clock signal terminal to receive a second clock signal, and a second electrode of the third transistor is connected to the second signal output terminal;

a first electrode of the first capacitor is connected to the first node, and a second electrode of the first capacitor is connected to the second electrode of the second transistor; and a first electrode of the second capacitor is connected to the first node, and a second electrode of the second capacitor is connected to the second electrode of the third transistor.

4. The shift register unit according to claim 2, wherein the second control circuit is connected to the second node, the first signal output terminal, and the second signal output terminal, and is configured to perform noise reduction on the first signal output terminal and the second signal output terminal under control of the level of the second node.

5. The shift register unit according to claim 4, wherein the second control circuit comprises an eighth transistor and a ninth transistor;

a gate electrode of the eighth transistor is connected to the second node, a first electrode of the eighth transistor is connected to the first signal output terminal, and a second electrode of the eighth transistor is connected to a fourth voltage terminal to receive a fourth voltage; and a gate electrode of the ninth transistor is connected to the second node, a first electrode of the ninth transistor is connected to the second signal output terminal, and a second electrode of the ninth transistor is connected to the fourth voltage terminal to receive the fourth voltage.

6. The shift register unit according to claim 1, wherein the input circuit comprises a fifth transistor, a gate electrode of the fifth transistor is connected to the signal input terminal to receive the input signal, and a first electrode of the fifth transistor is connected to the first node.

7. The shift register unit according to claim 6, wherein a second electrode of the fifth transistor is connected to a second voltage terminal to receive a second voltage.

8. The shift register unit according to claim 1, wherein the first control circuit comprises a sixth transistor and a seventh transistor;

a gate electrode of the sixth transistor and a first electrode of the sixth transistor are connected to a third voltage terminal to receive a third voltage, and a second electrode of the sixth transistor is connected to the second node; and a gate electrode of the seventh transistor is connected to the first node, a first electrode of the seventh transistor is connected to the second node, and a second electrode of the seventh transistor is connected to a fourth voltage terminal to receive a fourth voltage.

9. The shift register unit according to claim 1, wherein the third control circuit is configured to control the level of the first node in response to the level of the second node.

10. The shift register unit according to claim 1, further comprising a first reset circuit, wherein the first reset circuit is connected to the first node, and is configured to reset the first node in response to a first reset signal.

11. A display device, comprising the shift register unit according to claim 1.

12. A gate drive circuit, comprising a plurality of shift register units which are cascaded according to claim 1, wherein at least one shift register unit of the plurality of shift register units comprises: an input circuit, an output circuit, and a first control circuit, the input circuit is connected to a first node and a signal input terminal, and is configured to control a level of the first node in response to an input signal of the signal input terminal;

the output circuit is connected to the first node, a second node, and at least one clock signal terminal, and the output circuit comprises at least one signal output terminal;

the output circuit is configured to output at least one clock signal of the at least one clock signal terminal to the at least one signal output terminal under control of the level of the first node, and output a level of the second node to at least one of the at least one signal output terminal in a case where the first node is at a non-operating potential; and the first control circuit is connected to the first node and the second node, and is configured to control the level of the second node in response to the level of the first node.

13. A method for driving a shift register unit, wherein the shift register unit comprises: an input circuit, an output circuit, a first control circuit, a second control circuit, and a third control circuit, the input circuit is connected to a first node and a signal input terminal, and is configured to control a level of the first node in response to an input signal of the signal input terminal;

the output circuit is connected to the first node, a second node, and at least one clock signal terminal, and the output circuit comprises at least one signal output terminal;

the output circuit is configured to output at least one clock signal of the at least one clock signal terminal to the at least one signal output terminal under control of the level of the first node, and output a level of the second node to at least one of the at least one signal output terminal in a case where the first node is at a non-operating potential;

the first control circuit is connected to the first node and the second node, and is configured to control the level of the second node in response to the level of the first node;

wherein the output circuit further comprises an output sub-circuit and a voltage dividing control sub-circuit, the output sub-circuit is connected to the first node and the at least one clock signal terminal, and is configured to output the at least one clock signal of the at least one clock signal terminal to the at least one signal output terminal under control of the level of the first node, and the voltage dividing control sub-circuit is connected to the second node, and is configured to output, through the voltage dividing control sub-circuit, the level of the second node to the at least one signal output terminal in the case where the first node is at the non-operating potential, under control of the level of the second node, wherein the output sub-circuit comprises the third output sub-circuit comprising a fourth transistor;

a gate electrode of the fourth transistor is connected to the first node, a first electrode of the fourth transistor is connected to a third clock signal terminal to receive a third clock signal, and a second electrode of the fourth transistor is connected to a third signal output terminal;

the voltage dividing control sub-circuit comprises a first transistor, a first electrode of the first transistor is connected to the second node, a second electrode of the first transistor is connected to the third signal output terminal, a gate electrode of the first transistor is connected to the second node, and the voltage dividing control sub-circuit is configured to output the level of the second node to the third signal output terminal in the case where the gate electrode of the fourth transistor is at the non-operating potential, under control of the level of the first and second nodes in a reset period;

wherein the second control circuit is connected to the second node, and the output circuit, and the method comprises:

in a first phase, controlling, by the input circuit, the level of the first node in response to the input signal;

in a second phase, outputting, by the output circuit, the at least one clock signal of the at least one clock signal terminal to the at least one signal output terminal under control of the level of the first node; and in a third phase, outputting, by the output circuit, the level of the second node to the at least one of the at least one signal output terminal in the case where the first node is at the non-operating potential, under control of the level of the second node, wherein the third control circuit is connected to the first node and the second node, and the third control circuit comprises a tenth transistor; and a gate electrode of the tenth transistor is connected to the second node, a first electrode of the tenth transistor is connected to the first node, and a second electrode of the tenth transistor is connected to a fourth voltage terminal to receive a fourth voltage, and the width-to-length ratio of the channel of the fourth transistor is greater than the width-to-length ratio of the channel of the first transistor.

* * * * *